United States Patent [19]

Sameshima et al.

[11] Patent Number: 5,304,250
[45] Date of Patent: Apr. 19, 1994

[54] PLASMA SYSTEM COMPRISING HOLLOW MESH PLATE ELECTRODE

[75] Inventors: Toshiyuki Sameshima; Masaki Hara; Naoki Sano; Setsuo Usui, all of Kanagawa, Japan

[73] Assignee: Sony Corporation, Japan

[21] Appl. No.: 909,660

[22] Filed: Jul. 7, 1992

[30] Foreign Application Priority Data

Jul. 11, 1991 [JP] Japan .................. 3-196097

[51] Int. Cl.$^5$ .................................. C23C 16/50
[52] U.S. Cl. .................... 118/723 ER; 118/722; 118/723 E; 118/715; 156/345
[58] Field of Search ............ 118/723, 715, 723 E, 118/723 ER, 723 ME, 723 MR, 722; 156/345; 204/298.34

[56] References Cited

U.S. PATENT DOCUMENTS

| | | | |
|---|---|---|---|
| 4,243,506 | 1/1981 | Ikeda et al. | 156/345 X |
| 4,262,631 | 4/1981 | Kubacki | 118/723 X |
| 4,401,054 | 8/1983 | Matsuo et al. | 118/723 |
| 4,624,214 | 11/1986 | Suzuki et al. | 118/723 X |
| 4,691,662 | 9/1987 | Roppel et al. | 118/723 X |
| 4,971,653 | 11/1990 | Powell et al. | 156/345 X |
| 5,015,331 | 5/1991 | Powell | 204/298.34 X |
| 5,018,479 | 5/1991 | Markunas et al. | 118/723 |
| 5,105,761 | 4/1992 | Charlet et al. | 118/719 X |

FOREIGN PATENT DOCUMENTS

| | | | |
|---|---|---|---|
| 61-64124 | 4/1986 | Japan | 118/723 |
| 61-272386 | 12/1986 | Japan | 118/723 |
| 2-232372 | 9/1990 | Japan | 118/723 |

*Primary Examiner*—Brian E. Hearn
*Assistant Examiner*—Jonathan D. Baskin
*Attorney, Agent, or Firm*—Ronald P. Kananen

[57] ABSTRACT

A plasma system which eliminates damage derived from charged particles in the plasma and which is able to perform uniform plasma CVD and plasma etching on a large area substrate, wherein a mesh plate having a plurality of holes is placed at the interface of a plasma generation chamber and a substrate treatment chamber which holds a substrate, a high frequency electrical field being applied between an upper electrode in the plasma generation chamber and the mesh plate so as to disassociate the plasma forming gas by electrodischarge so as to cause the generation of plasma. By this, the plasma is isolated from the substrate. On the other hand, source gas supply ports are opened near the holes of the mesh plate, the source gas being introduced from there being brought into contact with the plasma through the holes, whereby the reaction product can be uniformly produced in a broad area. If the reaction product is a deposit-like substance, plasma CVD becomes possible, while if of the etching type, plasma etching becomes possible.

13 Claims, 3 Drawing Sheets

PLASMA SYSTEM COMPRISING HOLLOW MESH PLATE ELECTRODE

BACKGROUND OF THE INVENTION

1. Field of the Invention

The present invention relates to a plasma system using the remote plasma method of separation of the plasma and substrate. More particularly, this invention relates to a plasma system for performing uniform plasma CVD or plasma etching on a large area substrate.

2. Description of the Related Art

As a method of plasma treatment which reduces the damage caused by the plasma, there is known the remote plasma method. When this remote plasma method is applied to plasma CVD, the plasma generation chamber and the film deposition chamber are separated, a source gas is decomposed by the plasma near the interface between the two, and the reaction product produced at that time is deposited on a substrate placed in the film deposition chamber. By isolating the substrate from the plasma in this way, it is possible to lessen the damage to the substrate caused, mainly, by the charged particles in the plasma.

As a structure for separating the plasma generation chamber and the substrate treatment chamber, there is known, for example, an electron cyclotron resonance (ECR) plasma treatment apparatus such as is disclosed in Japanese Unexamined Published Patent Application No. 1-168027. In this apparatus, in the plasma generation chamber, the cyclotron angular frequency $w_c$ of the electrons engaged in cycloid motion due to the Lawrence force in the magnetic field and the angular frequency $w$ of the microwave field are made to match (to establish ECR conditions) and the microwave energy is made to be absorbed resonantly in the electrons to cause the production of ECR plasma. At that time, an antimagnetic effect appears due to the cyclotron resonance circular motion of the high energy electrons and a plasma flow is formed in the weak magnetic field direction due to the interaction with the dispersed magnetic field, so the substrate treatment chamber is provided in the weak magnetic field direction and ECR plasma treatment is performed on the substrate placed in the same.

In a conventional CVD apparatus based on the remote plasma method, however, generally the plasma generation chamber is small and, further, there is only one location where the source gas for the film formation can be broken down. Therefore, it was considered difficult to form a uniform film on a large area wafer such as one having an 8 inch diameter or a 12 inch diameter.

On the other hand, in the ECR plasma treatment apparatus described in the above publication, the openings in the source gas introduction system were located both near the leadout plate of the plasma and near the substrate so as to try to achieve uniform plasma treatment. The ECR plasma generated at the plasma generation chamber, however, was led out to the substrate treatment chamber along the dispersed magnetic field, and the ECR plasma acted directly on the substrate, so damage due to irradiation of the substrate by the ECR plasma could not be avoided.

SUMMARY OF THE INVENTION

The present invention has as its object the provision of a plasma system which can perform a uniform plasma treatment on a large area substrate while maintaining the effect of reduction of damage by the remote plasma method.

To resolve the above technical problems, the plasma system of the present invention is characterized in that it has, between the plasma generation chamber and the substrate treatment chamber, a mesh plate for plasma separation provided with a plurality of holes and in that source gas supply ports are provided near the holes of the mesh plate.

In the plasma system of the present invention, use is made of a mesh plate for plasma separation, so plasma is not led out toward the treated substrate in the substrate treatment chamber and no damage occurs on the treated substrate due to irradiation by plasma. Further, by the use of a mesh plate, due to the plurality of holes, the region where the plasma and the source gas react is dispersed in the plane of the plate and therefore it becomes possible to form a uniform film or etch a large area substrate. Also, by arranging the source gas supply ports near the holes, decomposition of the source gas occurs locally near the individual holes and the efficiency of production of the reaction product also becomes superior.

Further, according to the present invention, it is possible to construct a parallel plate type plasma system suitable for treatment of particularly large area substrates. In this case, the mesh plate forms one of a pair of opposing electrodes. By using this system, it is possible to perform plasma CVD, plasma etching, plasma surface improvement, and so forth, uniformly and with little damage.

In particular, the present invention is expected to mean an epoch-making improvement in the characteristics of thin film transistors (TFT) and other electron devices when used for the manufacture of such devices.

DESCRIPTION OF THE PREFERRED EMBODIMENTS

The present invention will be explained in detail below.

In the plasma system of the present invention, source gas supply ports are provided near the holes of the mesh plate. The source gas supply ports may be provided corresponding to the holes of the mesh plate or with one provided with respect to a predetermined number of holes. For example, in the former case where the source gas supply ports are provided corresponding to the holes, it is possible to make the source gas supply ports at parts of the inner walls of the holes and introduce the source gas from there, to cut through the ends of the holes on the substrate treatment chamber side to construct common source gas channels, to provide the source gas supply ports at the regions between adjoining holes on the surface of the mesh plate at the substrate treatment chamber side, and so forth. Alternatively, one may have a single source gas supply port correspond to a specific group of holes or provide a fixed number or variable number of source gas supply ports for each hole. The shape of the source gas supply ports is not particularly limited and the position of the source gas supply port may be made movable or adjustable. Alternatively, ports may be provided near the mesh plate on the surface at the substrate treatment chamber side so as to open from the periphery to the center.

Below, an example of the construction of a plasma CVD apparatus will be explained as a specific example of the present invention.

Figure 1:
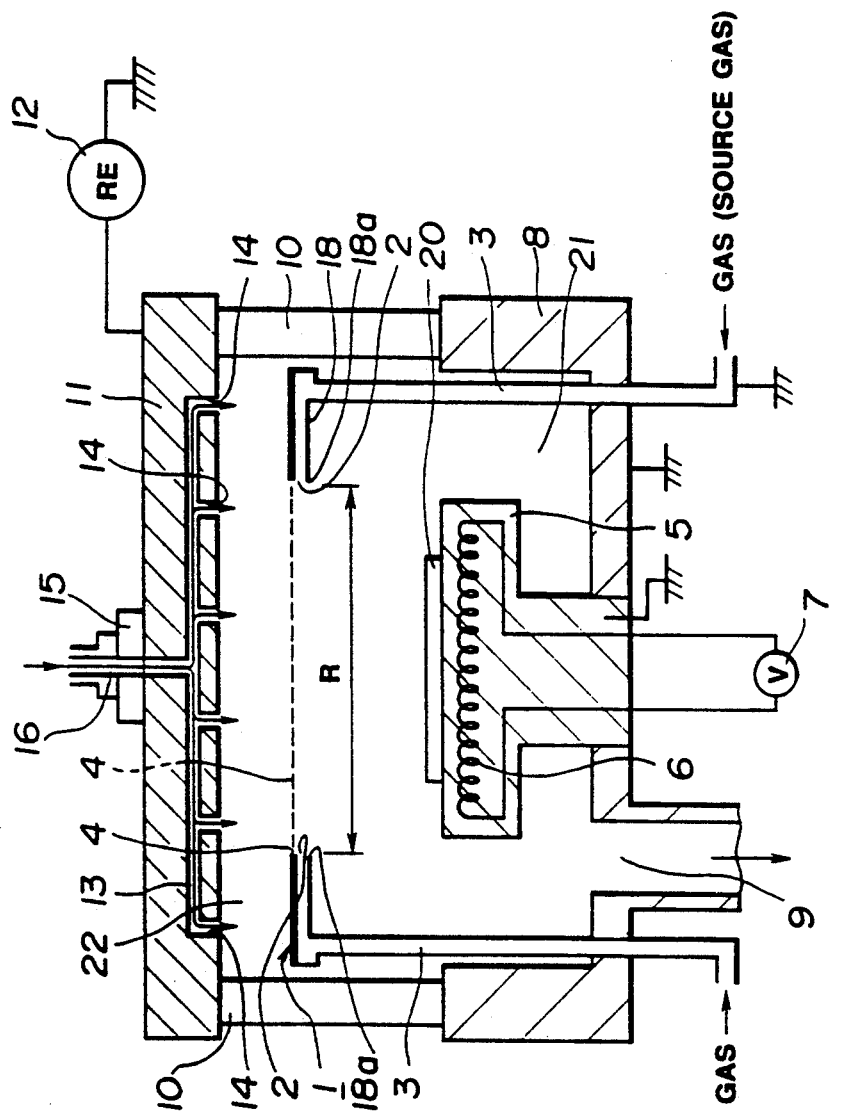
FIG. 1 is a schematic cross-sectional view of an example of a plasma system constructed using the present invention.

The present embodiment shows a plasma CVD apparatus, whose general structure is shown in FIG. 1. This plasma CVD apparatus is a parallel plate type CVD apparatus. The apparatus basically has a plasma generation chamber 22 and a substrate treatment chamber 21. A mesh plate 1 having a plurality of holes 4 is disposed at the interface of the chambers 22 and 21 for plasma separation.

The contour of the apparatus consists of a metallic outer wall member 8 for isolating the bottom of the apparatus and the lower part of the sides from the external environment, an insulating glass wall 10 for isolating the upper part of the side walls of the apparatus from the external environment, and a metallic upper electrode 11 which shuts the top portion of the glass wall 10. Here, the circumferential side surfaces of the outer wall member 8 and the glass wall 10 are cylindrical in shape, while the upper electrode 11 is substantially a disk in shape. In the chamber surrounded by the outer wall member 8, glass wall 10, and upper electrode 11 are provided the plasma generation chamber 22 and the substrate treatment chamber 21.

The plasma generation chamber 22 is comprised of the space between the upper electrode 11 and the mesh plate 1 and it is here that the plasma is generated. At the center portion of the upper electrode 11, a pipe 16 for introduction of the plasma generation gas is connected via a ceramic flange base 15 for promoting electrical insulation. The introduction pipe 16 is connected to a branch pipe 13 branching inside the upper electrode 11. The open ends of the branch pipe 13 approach the bottom surface of the upper electrode 11 and are used as the ports 14 for introduction of the plasma generating gas. These gas introduction ports 14 are disposed dispersed at predetermined intervals on the bottom surface of the upper electrode 11 so as to obtain a substantially uniform distribution of gas in the plasma generation chamber 22.

An RF power supply 12 is connected to the metallic upper electrode 11 and supplies RF power at the time of plasma generation. Corresponding to a lower electrode is the later mentioned mesh plate 1, which is disposed facing the upper electrode 11. Due to this, the apparatus has the structure of a parallel plate type CVD apparatus.

Next, the substrate treatment chamber 21 is comprised of the space below the mesh plate 1. A susceptor 5 is formed projecting out from the outer wall member 8 of the bottom of the substrate treatment chamber 21, which susceptor 5 has built in it a heater 6 for heating the substrate 20 to be plasma treated. The heater 6 receives a supply of power from a power supply 7 outside of the apparatus. At the bottom of the substrate treatment chamber 21 is connected an exhaust pipe 9 which is connected to a vacuum exhaust system (not shown), through which exhaust pipe 9 the chamber is exhausted to a high vacuum. The outer wall member 8 and the susceptor 5 are grounded.

Figure 2:
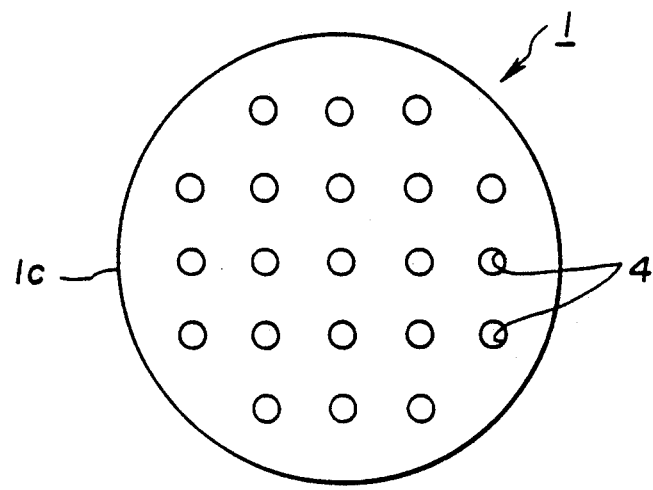
FIG. 2 is a schematic plan view of an example of the construction of a mesh plate of the above plasma CVD apparatus.

The mesh plate 1 is a metal plate for separating the above-mentioned substrate treatment chamber 21 and the plasma generation chamber 22. The planar shape is the shape as schematically shown in FIG. 2. The outer circumference 1c of the mesh plate 1 is made circular. This disk shaped mesh plate 1 is provided with a plurality of holes 4, which holes 4 are arranged in a matrix at approximately 5 mm intervals. The holes 4 are each of a diameter of approximately 3 mm. In this embodiment, the holes are of the same size, but it is also possible to make the sizes different at the inner circumferential side and the outer circumferential side. On the surface of the mesh plate 1 at the side of the susceptor 5 is provided a mesh rear 18. This mesh plate rear plate 18 is a metal plate provided with a hole 18a of a diameter R at its center. The clearance between the end portion constituting the hole 18a and the mesh plate 1 is used as the source gas supply ports 2. Specifically, the source gas supply ports 2 have cylindrical side sectional shapes. The source gas supply ports 2 are ports for the introduction of the source gas inside the substrate treatment chamber 21. In view of the construction of the mesh plate 1 and the mesh plate rear plate 18, the source gas supply ports 2 are disposed near the holes 4. The source gas is reliably fed toward the holes 4 of the mesh plate 1. The source gas supply ports 2 are connected at the portion of the outer circumference 1c of the mesh plate 1 to a plurality of metal pipes 3 which extend vertically down toward the bottom of the outer wall member 8 and support the mesh plate 1. The metal pipes 3 have a diameter of about $\frac{1}{8}$ mm. Source gas is supplied to these metal pipes 3 at the outside of the apparatus. These metal pipes 3 are grounded, by which the mesh plate 1 is also made a ground potential.

Next, an example of the deposition of a silicon oxide ($SiO_2$ film) using the plasma CVD apparatus of the above embodiment will be explained based on an experiment.

First, gas was discharged from the gas exhaust pipe 9 and the pressure inside the apparatus was adjusted to about 80 Pa (=600 mTorr), then $N_2O$ gas was passed from the introduction port 14 of the upper electrode 11 at a flow rate of 100 sccm and silane ($SiH_4$) gas diluted by 10 percent argon was supplied from the metal pipe 3 at a flow rate of 20 sccm. Next, 10 W RF power was supplied from the RF power supply 12 to the upper electrode 11 at a frequency of 13.56 MHz. Due to the supply of power from the RF power supply 12, stable generation of $N_2O$ plasma was observed in the plasma generation chamber 22 above the mesh plate 1, but there was no plasma electrodischarge at the substrate treatment chamber 21 below the mesh plate 1. The $N_2O$ plasma reacted with the silane gas introduced from the source gas supply ports 2 at the portions of the holes 4 of the mesh plate 1 to produce $SiO_2$, which deposited on the surface of the substrate 20 placed on the susceptor 5 under the mesh plate 1 to form a silicon oxide film.

Here, a study of the silicon oxide film deposited on the substrate 20 shows that when the temperature of the substrate caused by the heating by the heater 6 is about 250° C., the deposition speed is 17 nm/min and the index of refraction of the silicon oxide film is 1.47.

Next, for a comparison with this experiment, the same experiment was run for the case where the mesh plate 1 was removed. Under the above conditions, $N_2O$ gas was fed from the upper electrode 11 and silane gas was introduced from the metal pipes 3 to the substrate treatment chamber 21, whereupon the deposition speed was found to be 15 nm/min and the index of refraction was 1.46.

A comparison of the two experiments shows that the deposition speed does not fall at all even when the mesh plate 1 is used. Rather, the rate of deposition is somewhat higher in the case of use of the mesh plate 1. This is believed to be due to the fact that source gas is broken down by the plasma near the individual holes 4 and therefore the efficiency of production of $SiO_2$ is improved. Further, the indices of refraction of the resultant silicon oxide films are also equal, so there is almost no effect on the film quality either.

Further, the fact that the present invention reduces the damage caused by the plasma and makes it possible to manufacture devices with superior characteristics was experimentally shown by the fabrication of the following TFT device. For example, in an example where use was made of a plasma CVD apparatus of the embodiment for the formation of a gate oxide film of a TFT using a polycrystalline silicon layer for the channel layer, a gate oxide film of a thickness of 100 nm was formed on the polycrystalline silicon layer, whereupon the drain current became as much as 30 times greater than a conventional TFT with a gate oxide film formed by the conventional film forming method not using a mesh plate. This is because the interface between the silicon film and the silicon oxide film displays excellent electrical characteristics and is because the plasma damage is mitigated by the present invention, it was concluded.

Figure 3:
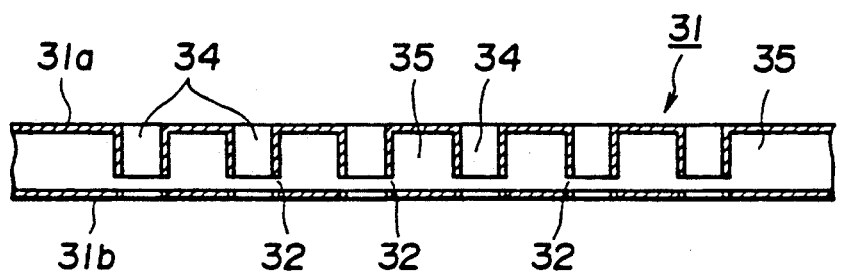
FIG. 3 is a schematic sectional view of another example of the construction of a mesh plate of the above plasma CVD apparatus.
Figure 4:
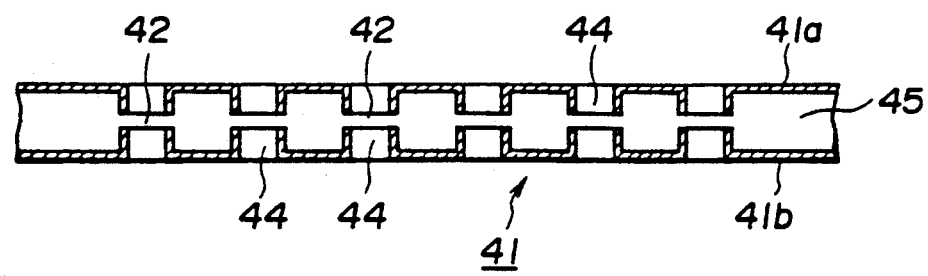
FIG. 4 is a schematic sectional view of still another example of the construction of a mesh plate of the above plasma CVD apparatus.

To enable uniform plasma CVD for a further large area wafer, use may be made of mesh plates having the sectional structures shown in FIG. 3 and FIG. 4. Note that the mesh plates of FIGS. 3 and 4 are constructed to have a planar shape as shown, for example, in FIG. 2.

FIG. 3 is an example of the construction of the mesh plate 31 and shows a section along the line connecting the centers of the holes 34 passing through the surface and rear. The holes 34 are cylindrical throughholes. The holes 34 of the mesh plate 31 are also similarly arranged in a matrix like with the mesh plate 1 of FIG. 2. The mesh plate 31 is made a hollow unit 35 with a relatively high conductance between the front surface 31a and the rear surface 31b, with the source gas passing through the hollow unit 35. At the rear surface 31b sides of the holes 34, the openings 32 are provided corresponding with each of the holes 34, which openings 32 are used as the source gas supply ports. The openings 32 are shaped to gird the side walls of the holes 34 thereby forming clearance portions between the rear surface 31b and the side walls of the holes 34. The source gas introduced from the openings 32 reacts with the plasma generated at the front surface 31a side of the mesh plate 31 and leaking inside the holes 34. That is, the reaction between the plasma and the source gas occurs simultaneously at the positions of the openings of the holes 34, so the reaction product is formed while dispersing over the entire mesh plate 31. Therefore, a uniform film can be formed even on a large area wafer.

FIG. 4 is an example of the construction of another mesh plate 41, which has openings 42 in the middles of the holes 44 passing through the surface 41a and the rear 41b. Even in this mesh plate 41, the hollow portions 45 have the same high conductance as in the mesh plate 31 of FIG. 3 and source gas is sent uniformly to the holes 44 through the openings 42. Therefore, the reaction between the plasma and the source gas proceeds uniformly over the entire mesh plate 41 and a uniform film is formed.

Figure 5:
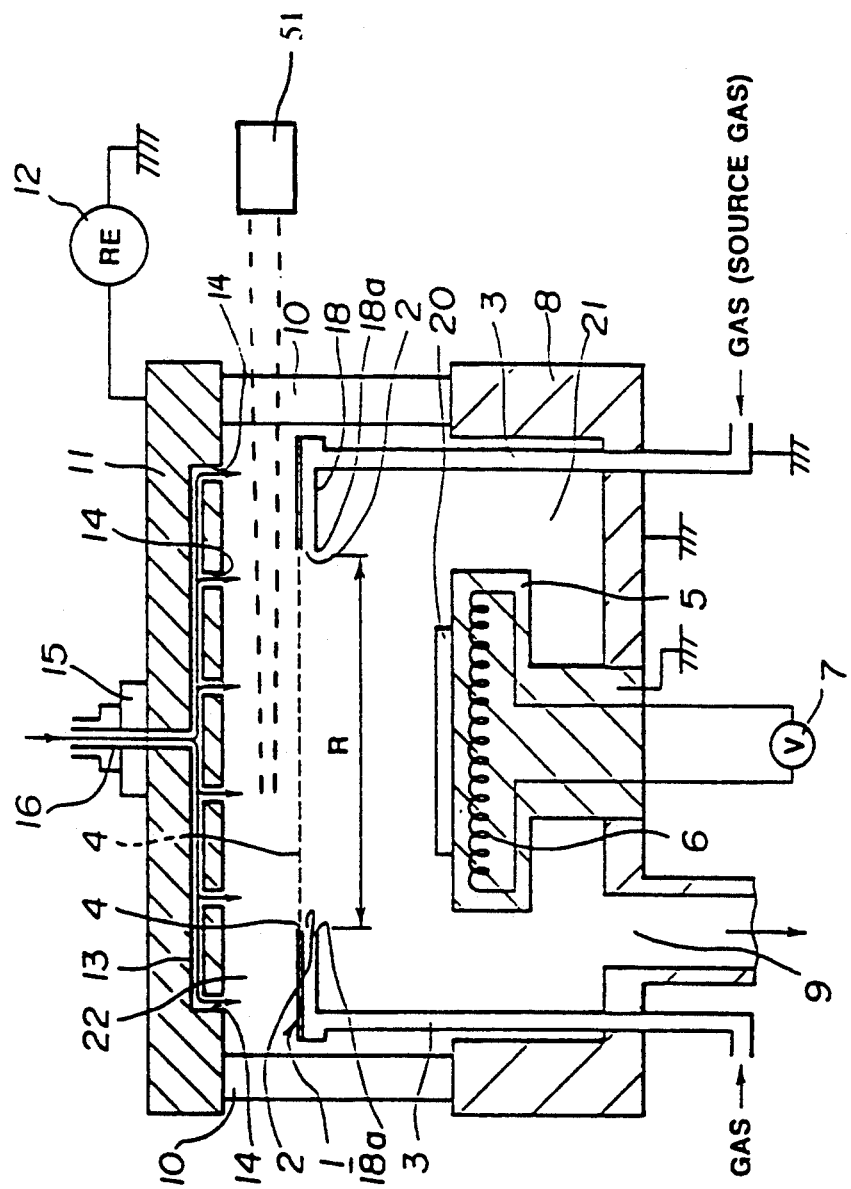
FIG. 5 is a schematic cross-sectional view of an example of a plasma system with a light irradiating means constructed in accordance with the present invention.

Note that in the above embodiment, the explanation was made with reference to plasma CVD, but that the plasma system of the present invention may be another system such as a plasma etching system as well. In particular, when applied to plasma etching, the chemical seeds drawn out through the mesh plate to the substrate treatment chamber side are neutral active seeds, whereby low damage etching becomes possible. Further, it is possible to reduce the amount of over-etching by realization of a uniform etching speed, which is extremely effective in achieving high selectivity, low damage, low contamination, etc. Further, as shown in FIG. 5, provision may be made of irradiation means 51 for various types of light or lasers etc. and there is no limitation as to the shape, size, or position of the holes or source gas supply ports (openings). These may be designed in accordance with need within the gist of the present invention.

We claim:

1. A plasma system characterized in that provision is made, between a plasma generation chamber and a substrate treatment chamber, of a mesh plate for plasma separation having a plurality of holes and source gas supply ports made near the holes of the mesh plate and in that a high frequency electrical field is applied between an upper electrode in the plasma generation chamber and the mesh plate, which is arranged in parallel facing said upper electrode, so as to disassociate a plasma forming gas by electrodischarge so plasma is generated, the plasma and a source gas supplied from said source gas supply ports being made to react near each of the holes, whereby the reaction product is made to deposit on a substrate placed in the substrate treatment chamber, further characterized in that the mesh plate is a hollow unit having a front surface on a side closest to said upper electrode and a rear surface on a side closest to said substrate treatment chamber, said holes through said mesh plate being formed as throughholes having cylindrical side walls extending between said front and rear surfaces, and said source gas supply ports comprising clearance portions formed between the rear surface and the cylindrical side walls of the holes of the mesh plate.

2. A plasma system as set forth in claim 1, characterized in that the comprised having clearance portions with the rear surface plate disposed separate at the substrate treatment chamber side facing the nonformed portions of the holes of the mesh plate and in that plasma forming gas is $N_2O$, the source gas is $SiH_4$, and a silicon oxide film is formed on the substrate.

3. A plasma system as set forth in claim 1, characterized in that provision is made of a light irradiating means for assisting the excitation of the plasma.

4. A plasma system characterized in that provision is made, between a plasma generation chamber and a substrate treatment chamber, of a mesh plate for plasma separation having a plurality of holes and source gas supply ports made near the holes of the mesh plate and in that a high frequency electrical field is applied between an upper electrode in the plasma generation chamber and the mesh plate, which is arranged in parallel facing said upper electrode, so plasma is generated, the plasma and a source gas supplied from the source gas supply ports being made to react near each of the holes, whereby the reaction product is made to deposit on a substrate placed in the substrate treatment chamber, further characterized in that the source gas supply ports are made to correspond at least one with each of the holes.

5. A plasma system as set forth in claim 4, characterized in that provision is made of a light irradiating means for assisting the excitation of the plasma.

6. A plasma system characterized in that provision is made, between a plasma generation chamber and a substrate treatment chamber, of a mesh plate for plasma separation having a plurality of holes and source gas supply ports made near the holes of the mesh plate and in that a high frequency electrical field is applied between an upper electrode in the plasma generation chamber and the mesh plate, which is arranged in parallel facing said upper electrode, so plasma is generated, the plasma and a source gas supplied from said source gas supply ports being made to react near each of the holes, whereby the reaction product is made to deposit on a substrate placed in the substrate treatment chamber, further characterized in that the mesh plate is made of a hollow construction having a front surface closest to said upper electrode and a rear surface closest said substrate treatment chamber, said holes including side walls extending between said front and rear surfaces, and said source gas supply ports comprising clearance portions formed between said rear surface and said side walls of each of the holes passing through the mesh plate.

7. A plasma system as set forth in claim 6, characterized in that a plasma forming gas comprising $N_2O$ is introduced into said plasma generation chamber, the source gas is $SiH_4$, and a silicon oxide film is formed on the substrate.

8. A plasma system characterized in that provision is made, between a plasma generation chamber and a substrate treatment chamber, of a mesh plate for plasma separation having a plurality of holes and source gas supply ports made near the holes of the mesh plate and in that a high frequency electrical field is applied between an upper electrode in the plasma generation chamber and the mesh plate, which is arranged in parallel facing said upper electrode, so plasma is generated, the plasma and a source gas supplied from said source gas supply ports being made to react near each of the holes, whereby the reaction product is made to deposit on a substrate placed in the substrate treatment chamber, further characterized in that the mesh plate is made of a hollow construction having a front surface closest to said upper electrode and a rear surface closest said substrate treatment chamber, said holes including side walls extending between said front and rear surfaces, and said source gas supply ports being formed as openings in the middles of the side walls of each of the holes passing through the mesh plate.

9. A plasma system as set forth in claim 8, characterized in that a plasma forming gas comprising $N_2O$ is introduced into said plasma generation chamber, the source gas is $SiH_4$, and a silicon oxide film is formed on the substrate.

10. A plasma system characterized in that provision is made, between a plasma generation chamber and a substrate treatment chamber, of a mesh plate for plasma separation having a plurality of holes and in that a high frequency electrical field is applied between an upper electrode in the plasma generation chamber and the mesh plate, which is arranged in parallel facing said upper electrode, so plasma is generated, the plasma and an etching gas supplied from said source gas supply ports being made to react near each of the holes, whereby the thus produced active seeds are made to irradiate on a substrate placed in the substrate treatment chamber, further characterized in that the source gas supply ports are made to correspond at least one with each of the holes.

11. A plasma system as set forth in claim 10, characterized in that provision is made of a light irradiating means for assisting the excitation of the plasma.

12. A plasma system characterized in that provision is made, between a plasma generation chamber and a substrate treatment chamber, of a mesh plate for plasma separation having a plurality of holes and in that a high frequency electrical field is applied between an upper electrode in the plasma generation chamber and the mesh plate, which is arranged in parallel facing said upper electrode, so plasma is generated, the plasma and an etching gas supplied from said source gas supply ports being made to react near each of the holes, whereby the thus produced active seeds are made to irradiate on a substrate placed in the substrate treatment chamber, further characterized in that the mesh plate is made of a hollow construction having a front surface closest to said upper electrode and a rear surface closest said substrate treatment chamber, said holes including side walls extending between said front and rear surfaces, and said source gas supply ports comprising clearance portions formed between said rear surface and said side walls of each of the holes passing through the mesh plate.

13. A plasma system characterized in that provision is made, between a plasma generation chamber and a substrate treatment chamber, of a mesh plate for plasma separation having a plurality of holes and in that a high frequency electrical field is applied between an upper electrode in the plasma generation chamber and the mesh plate, which is arranged in parallel facing said upper electrode, so plasma is generated, the plasma and an etching gas supplied from said source gas supply ports being made to react near each of the holes, whereby the thus produced active seeds are made to irradiate on a substrate placed in the substrate treatment chamber, further characterized in that the mesh plate is made of a hollow construction having a front surface closest to said upper electrode and a rear surface closest said substrate treatment chamber, said holes including side walls extending between said front and rear surfaces, and said source gas supply ports being formed as openings in the middles of the side walls of each of the holes passing through the mesh plate.

* * * * *